(12) United States Patent
Chen et al.

(10) Patent No.: US 9,312,819 B1
(45) Date of Patent: Apr. 12, 2016

(54) ACTIVE INDUCTOR AND ASSOCIATED AMPLIFYING CIRCUIT

(71) Applicants: GLOBAL UNICHIP CORPORATION, Hsinchu (TW); TAIWAN SEMICONDUCTOR MANUFACTURING CO., LTD, Hsin-Chu (TW)

(72) Inventors: Yen-Chung Chen, Santa Clara, CA (US); Tsai-Ming Yang, Tainan (TW); Yi-Lin Lee, Tainan (TW)

(73) Assignees: GLOBAL UNICHIP CORPORATION, Hsinchu (TW); TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/666,779

(22) Filed: Mar. 24, 2015

(51) Int. Cl.
*H03H 11/00* (2006.01)
*H03H 11/48* (2006.01)
*H03F 3/45* (2006.01)
*H03F 1/42* (2006.01)
*H03F 3/16* (2006.01)

(52) U.S. Cl.
CPC .. *H03F 1/42* (2013.01); *H03F 3/16* (2013.01); *H03F 3/45179* (2013.01); *H03H 11/48* (2013.01); *H03F 2203/45026* (2013.01); *H03F 2203/45201* (2013.01); *H03F 2203/45244* (2013.01)

(58) Field of Classification Search
CPC ..... H03H 11/48; H03H 11/08; H03H 11/486; H03H 11/50
USPC .................................................. 333/213–215
See application file for complete search history.

(56) References Cited

U.S. PATENT DOCUMENTS

| 6,825,722 | B2 * | 11/2004 | Segawa | H03D 7/1441 330/253 |
| 7,049,888 | B2 * | 5/2006 | Soda | H03F 3/45381 330/253 |
| 7,199,685 | B2 * | 4/2007 | Gill | H03H 11/48 333/214 |
| 7,253,707 | B2 * | 8/2007 | Mukhopadhy | H03H 11/48 333/214 |

(Continued)

OTHER PUBLICATIONS

Eduard Sackinger et al, "A 3-GHz 32-dB CMOS Limiting Amplifier for SONET OC-48 Receivers", IEEE Journal of Solid-State Circuits, vol. 35, Dec. 2000.

(Continued)

*Primary Examiner* — Dean Takaoka
*Assistant Examiner* — Alan Wong
(74) *Attorney, Agent, or Firm* — WPAT, PC; Justin King

(57) ABSTRACT

An active inductor includes a first transistor, a capacitor, a second transistor, a first resistor, a second resistor, and a bias current source. A source terminal of the first transistor is a first terminal of the active inductor and connected to a first voltage source. The capacitor is connected to the source terminal and gate terminal of the first transistor. A drain terminal of the second transistor is connected to the source terminal of the first transistor. A gate terminal of the second transistor is connected to a drain terminal of the first transistor. The first resistor is connected between the drain terminal of the first transistor and a second terminal of the active inductor. The second resistor is connected to a source terminal of the second transistor. The bias current source is connected between the second resistor and a second voltage source.

7 Claims, 5 Drawing Sheets

(56) References Cited

U.S. PATENT DOCUMENTS 8,115,575 B2 * 2/2012 Hsu ............... H03H 11/08
333/214
9,024,710 B2 * 5/2015 Kimura ............ H03H 11/48
333/213

OTHER PUBLICATIONS

Thomas H. Lee, "The Design of CMOS Radio-Frequency Integrated Circuits", Second Edition, Cambridge University Press, 2004, part 1 of 4.
Thomas H. Lee, "The Design of CMOS Radio-Frequency Integrated Circuits", Second Edition, Cambridge University Press, 2004, part 2 of 4.
Thomas H. Lee, "The Design of CMOS Radio-Frequency Integrated Circuits", Second Edition, Cambridge University Press, 2004, part 3 of 4.
Thomas H. Lee, "The Design of CMOS Radio-Frequency Integrated Circuits", Second Edition, Cambridge University Press, 2004, part 4 of 4.
Seon-Kyoo Lee et al, "A 95fJ/b Current-Mode Transceiver for 10mm On-Chip Interconnect", Feb. 19, 2013.

* cited by examiner

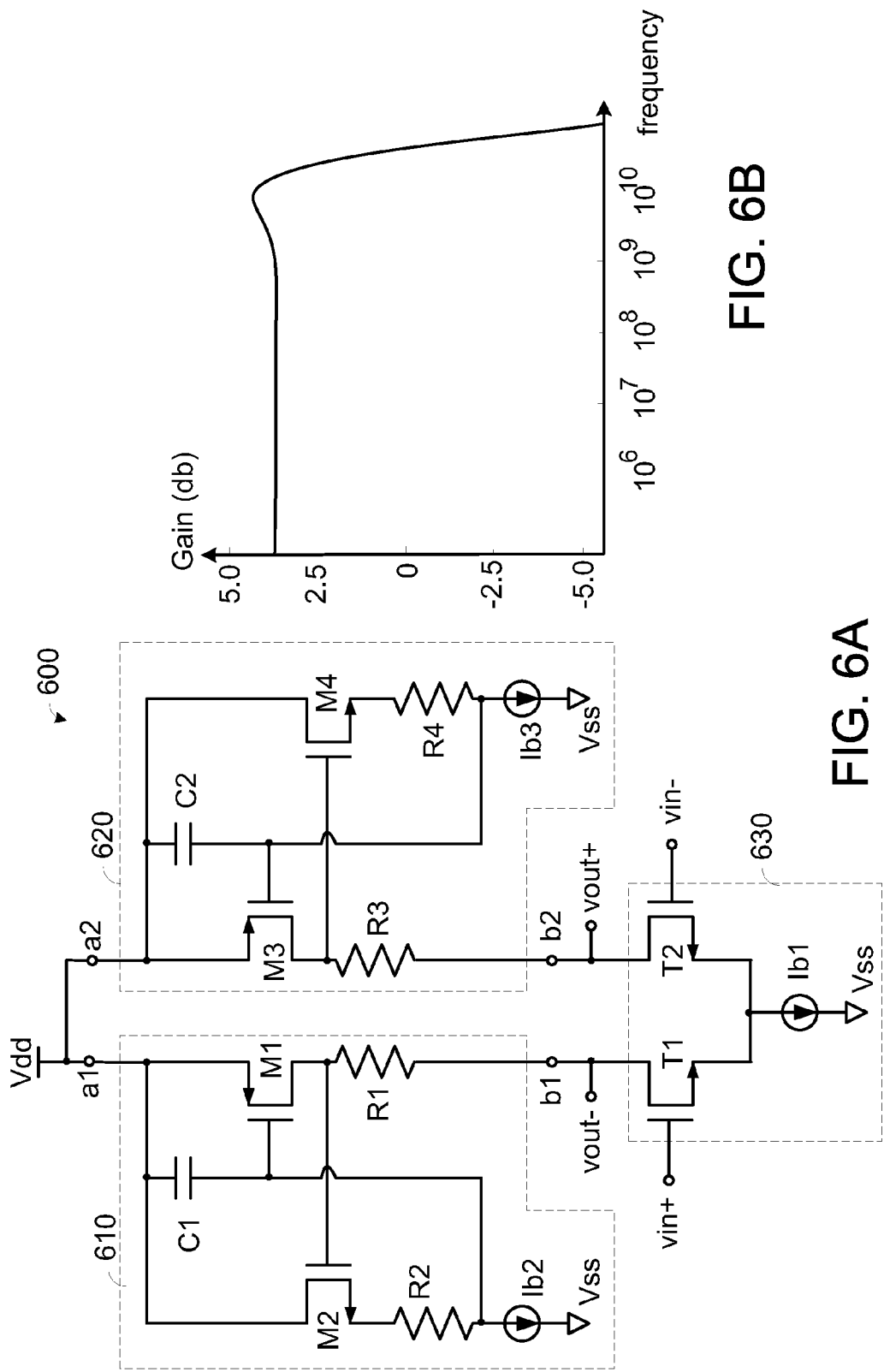

ACTIVE INDUCTOR AND ASSOCIATED AMPLIFYING CIRCUIT

FIELD OF THE INVENTION

The present invention relates to an inductor and an associated amplifying circuit, and more particularly to an active inductor and an associated amplifying circuit.

BACKGROUND OF THE INVENTION

Conventionally, a shunt-peaking technique is widely used to effectively increase the circuit bandwidth. FIG. 1A is a schematic circuit diagram of a conventional amplifying circuit. FIG. 1B is a plot illustrating the relationships between the gain value and the frequency of the amplifying circuit of FIG. 1A.

As shown in FIG. 1A, the amplifying circuit 100 comprises a transistor T, a capacitor C, a resistor R and an inductor L. The resistor R and the inductor L are connected with each other in series and collaboratively considered as an inductive load 110.

The gate terminal of the transistor T is an input terminal of the amplifying circuit 100 for receiving an input signal vi. The drain terminal of the transistor T is an output terminal of the amplifying circuit 100 for outputting an output signal vo. The source terminal of the transistor T is connected to a ground terminal. The resistor R and the inductor L are serially connected between a voltage source Vdd and the output terminal of the amplifying circuit 100. The capacitor C is connected between the output terminal of the amplifying circuit 100 and the ground terminal.

Please refer to the spectrum diagram of FIG. 1B. If the inductor L is not included in the amplifying circuit 100 (i.e. L=0), the amplifying circuit 100 has a bandwidth x. Whereas, if the inductor L is included in the amplifying circuit 100, the bandwidth of the amplifying circuit 100 gradually increases with the increasing inductance value.

In case that the inductor L of the amplifying circuit 100 has the optimal inductance value Lopt, the bandwidth of the amplifying circuit 100 is approximately equal to 1.7x. In other words, the bandwidth of the amplifying circuit 100 having the inductor L with the optimal inductance value Lopt is about 1.7 times the bandwidth of the amplifying circuit 100 having no inductor. For example, the optimal inductance value Lopt is $0.4R^2C$ for a maximally flat frequency response.

Moreover, in case that the inductance value of the inductor L is higher than the optimal inductance value Lopt, the gain value at the corner frequency increases. In other words, the inductor L of the amplifying circuit 100 can further increase the bandwidth of the amplifying circuit 100 if gain peaking of around 20% can be tolerated.

Generally, for designing IC circuitry, the inductor can be designed on a two-dimensional plane. However, the area budget of this type of IC circuitry is often constrained, it is difficult to design the inductor having the optimized performance within reasonable area. For increasing the circuit bandwidth, an active inductor was disclosed. Since the active inductor has the characteristics of the conventional inductor, the active inductor may be applied to the amplifying circuit.

FIG. 2A is a schematic circuit diagram of a conventional active inductor. FIG. 2B is a schematic circuit diagram illustrating a small signal model of the conventional active inductor of FIG. 2A. FIG. 2C is a plot illustrating the relationships between the impedance and the frequency of the conventional active inductor of FIG. 2A. The active inductor 210 may be connected to the output terminal of the amplifying circuit 100 as shown in FIG. 1A in order to replace the inductive load 110 of the amplifying circuit 100.

As shown in FIG. 2A, the active inductor 210 comprises a transistor M and a resistor R. The resistor R is connected between the gate terminal of the transistor M and the voltage source Vdd. The drain terminal of the transistor M is connected to the voltage source Vdd.

Please refer to FIG. 2B. In the small signal model of the active inductor 210, a parasitic capacitor Cgs is connected between the gate terminal and the source terminal of the transistor M. According to a gate-source voltage signal vgs, a current flows through the drain terminal and the source terminal. The magnitude of the small signal current is equal to gm×vgs, wherein gm is a transconductance value of the transistor M.

Please refer to FIG. 2C, which illustrates the relationships between the impedance and the frequency of the conventional active inductor 210. In case that the frequency is lower than ωz, the magnitude of the small-signal impedance (|z(jω)|) is 1/gm. In case that the frequency is higher than oz, the magnitude of the impedance (|z(jω)|) rises and reaches its maximum of R. If R>1/gm, the active inductor 210 has lower impedance in the lower frequency band and higher impedance in the higher frequency band. Consequently, the active inductor 210 may be considered as the inductive load.

FIG. 3 is a schematic circuit diagram of another conventional active inductor. The active inductor 310 may be connected to the output terminal of the amplifying circuit 100 as shown in FIG. 1A in order to replace the inductive load 110 of the amplifying circuit 100.

As shown in FIG. 3, the active inductor 310 comprises a transistor M, a capacitor L and a resistor R. The drain terminal of the transistor M is connected to a first voltage source Vdd. The resistor R is connected between the gate terminal of the transistor M and a second voltage source Vbh. The capacitor C is connected between the second voltage source Vbh and a ground terminal. Generally, the relationships between the impedance and the frequency of the active inductor 310 are similar to the relationships between the impedance and the frequency of the active inductor 210, and are not redundantly described herein. Moreover, the active inductor 310 may be considered as the inductive load.

SUMMARY OF THE INVENTION

The present invention provides an active inductor with a novel structure. Consequently, the active inductor is used as an inductive load and applied to an amplifying circuit to increase the circuit bandwidth.

An embodiment of the present invention provides an active inductor. The active inductor includes a first transistor, a capacitor, a second transistor, a first resistor, a second resistor, and a bias current source. A source terminal of the first transistor is a first terminal of the active inductor and connected to a first voltage source. A first terminal of the capacitor is connected to the source terminal of the first transistor. A second terminal of the capacitor is connected to a gate terminal of the first transistor. A drain terminal of the second transistor is connected to the source terminal of the first transistor. A gate terminal of the second transistor is connected to a drain terminal of the first transistor. A first terminal of the first resistor is connected to the drain terminal of the first transistor. A second terminal of the first resistor is connected to a second terminal of the active inductor. A first terminal of the second resistor is connected to a source terminal of the second transistor and a second terminal of the second resistor is connected to the gate terminal of the first transistor. A first terminal of the bias current source is connected to the second terminal of the second resistor. A second terminal of the bias current source is connected to a second voltage source.

Another embodiment of the present invention provides an amplifying circuit. The amplifying circuit includes a first transistor, a first active inductor and a first bias current source. A gate terminal of the first transistor receives a first input signal. A drain terminal of the first transistor generates a first output signal. The first active inductor is connected between a first voltage source and the drain terminal of the first transistor. The first bias current source is connected between a second voltage source and a source terminal of the first transistor. The first active inductor includes a second transistor, a third transistor, a first capacitor, a first resistor, a second resistor and a second bias current source. A source terminal of the second transistor is connected to the first voltage source. A first terminal of the first capacitor is connected to the source terminal of the second transistor. A second terminal of the first capacitor is connected to a gate terminal of the second transistor. A drain terminal of the third transistor is connected to the source terminal of the second transistor. A gate terminal of the third transistor is connected to a drain terminal of the second transistor. A first terminal of the first resistor is connected to the drain terminal of the second transistor. A second terminal of the first resistor is connected to the drain terminal of the first transistor. A first terminal of the second resistor is connected to a source terminal of the third transistor. A second terminal of the second resistor is connected to the gate terminal of the first transistor. A first terminal of the second bias current source is connected to the second terminal of the second resistor. A second terminal of the second bias current source is connected to a second voltage source.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6A is a schematic circuit diagram of a differential amplifying circuit with the active inductors of the present invention; and FIG. 6B is a plot illustrating the relationships between the gain value and the frequency of the differential amplifying circuit of FIG. 6A.

DETAILED DESCRIPTION OF PREFERRED EMBODIMENTS

Figures 1A, 1B:
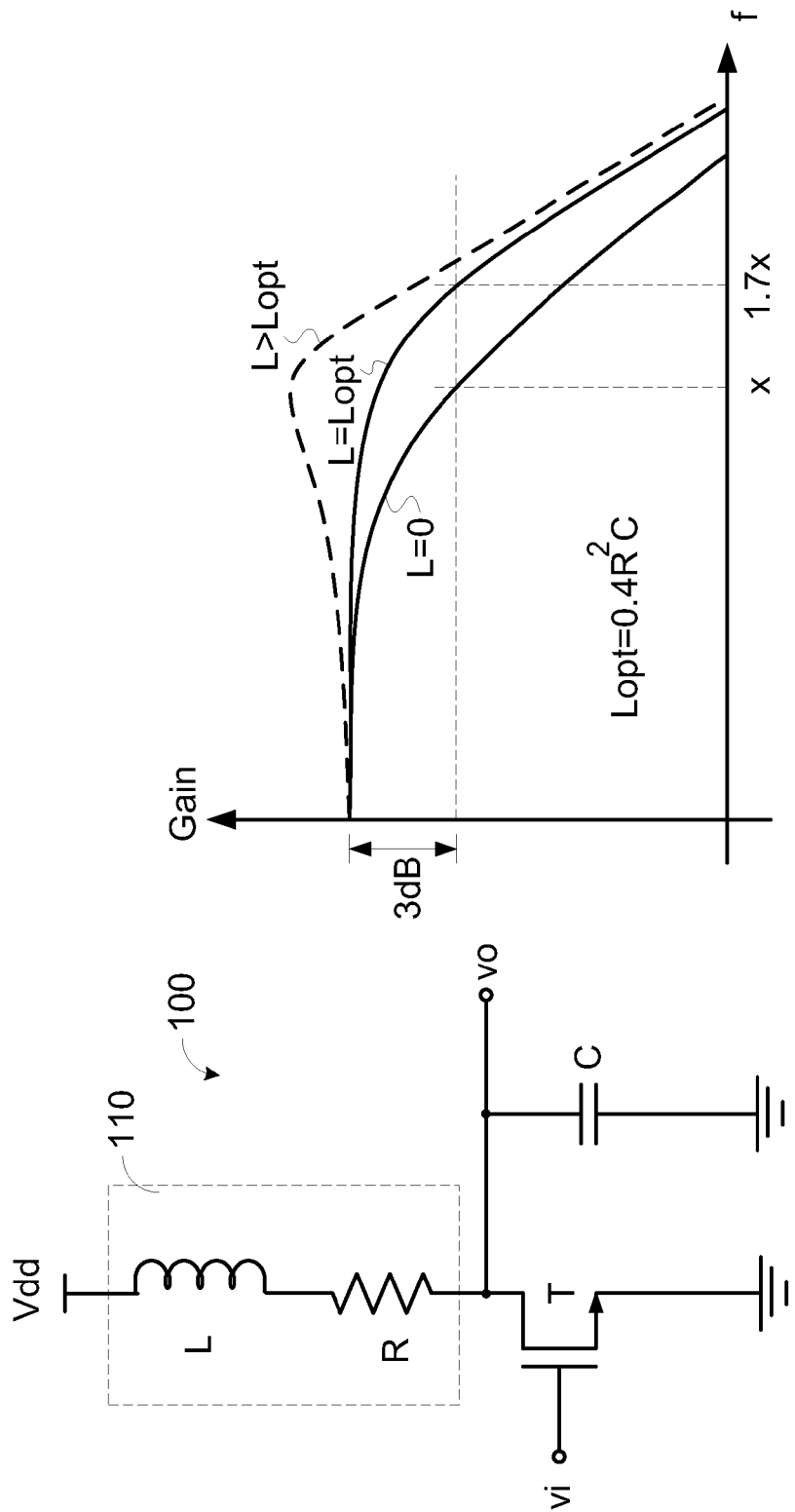
FIG. 1A (prior art) is a schematic circuit diagram of a conventional amplifying circuit.
FIG. 1B (prior art) is a plot illustrating the relationships between the gain value and the frequency of the amplifying circuit of FIG. 1A.
Figure 2A:
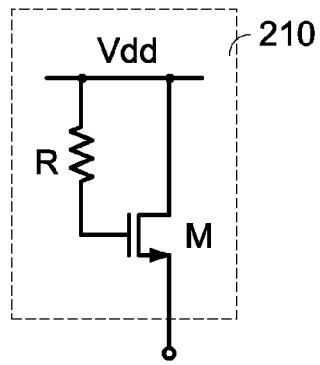
FIG. 2A (prior art) is a schematic circuit diagram of a conventional active inductor.
Figure 2B:
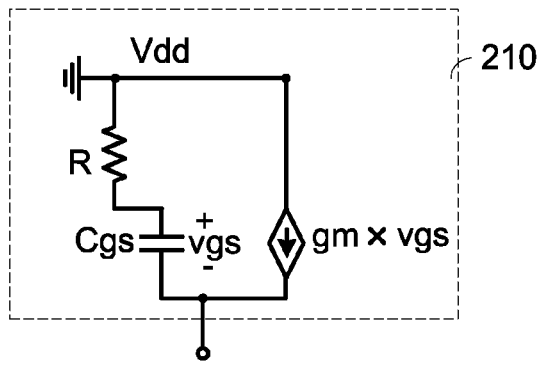
FIG. 2B (prior art) is a schematic circuit diagram illustrating a small signal model of the conventional active inductor of FIG. 2A.
Figure 2C:
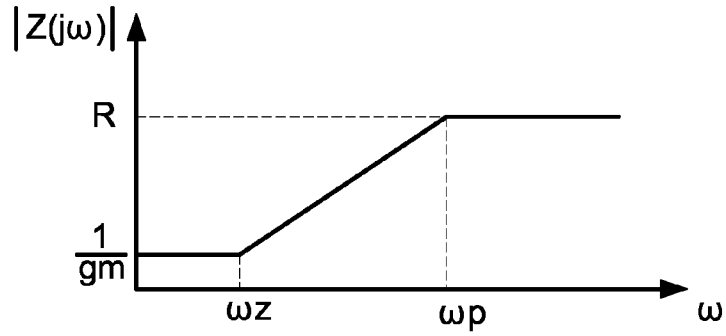
FIG. 2C (prior art) is a plot illustrating the relationships between the impedance and the frequency of the conventional active inductor of FIG. 2A.
Figure 3:
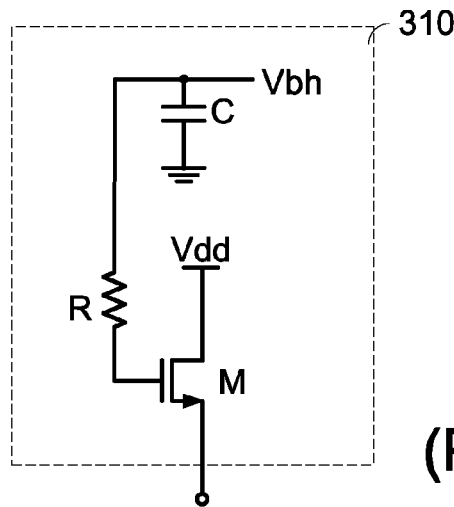
FIG. 3 (prior art) is a schematic circuit diagram of another conventional active inductor.
Figure 4A:
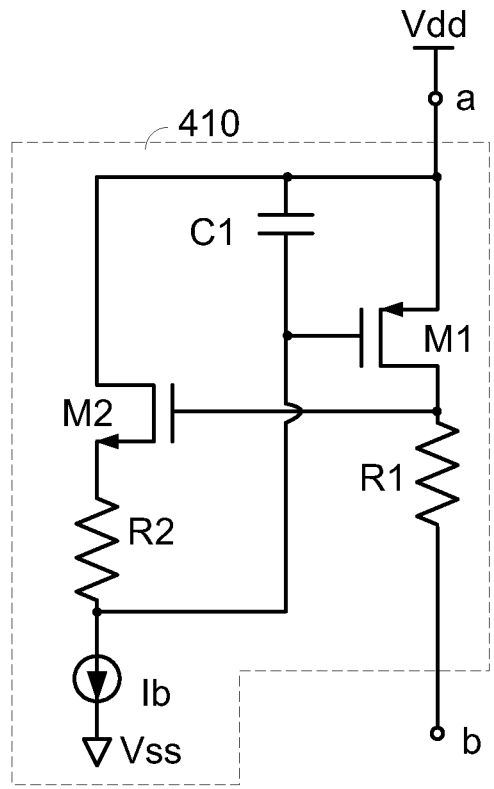
FIG. 4A is a schematic circuit diagram of an active inductor according to an embodiment of the present invention.
Figure 4B:
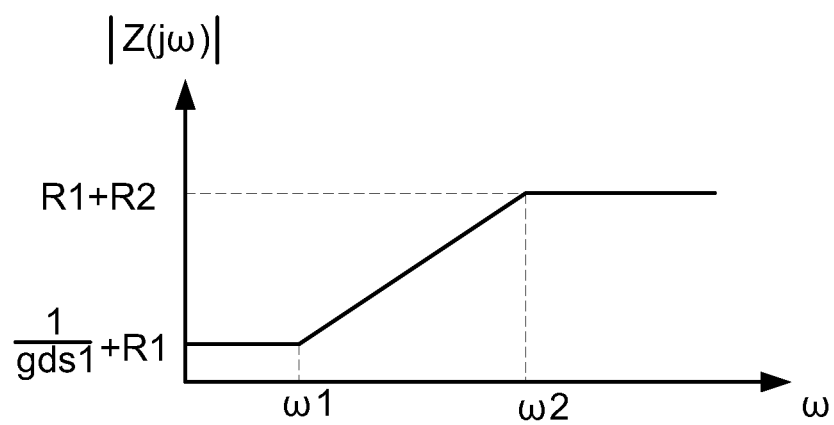
FIG. 4B is a plot illustrating the relationships between the impedance and the frequency of the active inductor of FIG. 4A.

FIG. 4A is a schematic circuit diagram of an active inductor according to an embodiment of the present invention. FIG. 4B is a plot illustrating the relationships between the impedance and the frequency of the active inductor of FIG. 4A. As shown in FIG. 4A, the active inductor 410 comprises a transistor M1, a transistor M2, a first resistor R1, a second resistor R2, a capacitor C1 and a bias current source Ib. Moreover, the active inductor 410 has a first terminal "a" and a second terminal "b". The first terminal "a" of the active inductor 410 is connected to a first voltage source Vdd. Moreover, the transistor M1 is a P-type transistor, and the transistor M2 is an N-type transistor.

The source terminal of the transistor M1 is connected to the first terminal "a" of the active inductor 410. A first terminal of the capacitor C1 is connected to the source terminal of the transistor M1. A second terminal of the capacitor C1 is connected to the gate terminal of the transistor M1. The drain terminal of the transistor M2 is connected to the source terminal of the transistor M1. The gate terminal of the transistor M2 is connected to the drain terminal of the transistor M1. A first terminal of the first resistor R1 is connected to the drain terminal of the transistor M1. A second terminal of the first resistor R1 is connected to the second terminal "b" of the active inductor 410. A first terminal of the second resistor R2 is connected to the source terminal of the transistor M2. A first terminal of the bias current source Ib is connected to a second terminal of the second resistor R2. A second terminal of the bias current source Ib is connected to a second voltage source Vss.

In case that the operational frequency is low, the transistor M1 is operated in triode region, transistor M2 is operated at saturation region, acting as a source follower and biases gate of transistor M1 properly so it remains in triode region. The capacitor C1 at low frequency can be considered in an open-circuit state. Under this circumstance, the impedance value of the active inductor 410 is equal to (1/gds1)+R1, wherein gds1 is the conductance value of the transistor M1 if operated in triode region.

Whereas, in case that the operational frequency is higher, the parasitic capacitor Cgs of the transistor M1 and the transistor M2 is in a short-circuit state and the capacitor C1 is in the short-circuit state. Under this circumstance, the impedance value of the active inductor 410 is approximately equal to R1+R2.

Please refer to FIG. 4B, which illustrates the relationships between the impedance and the frequency of the active inductor 410. In case that the frequency is lower than ω1, the magnitude of the impedance (|z(jω)|) is about (1/gds1)+R1. In case that the frequency is higher than ω2, the magnitude of the impedance (|z(jω)|) is about R1+R2. Since R2>1/gds1, the active inductor 410 has lower impedance in the lower frequency band and higher impedance in the higher frequency band. Consequently, this has the characteristics of an inductive load.

Figure 5:
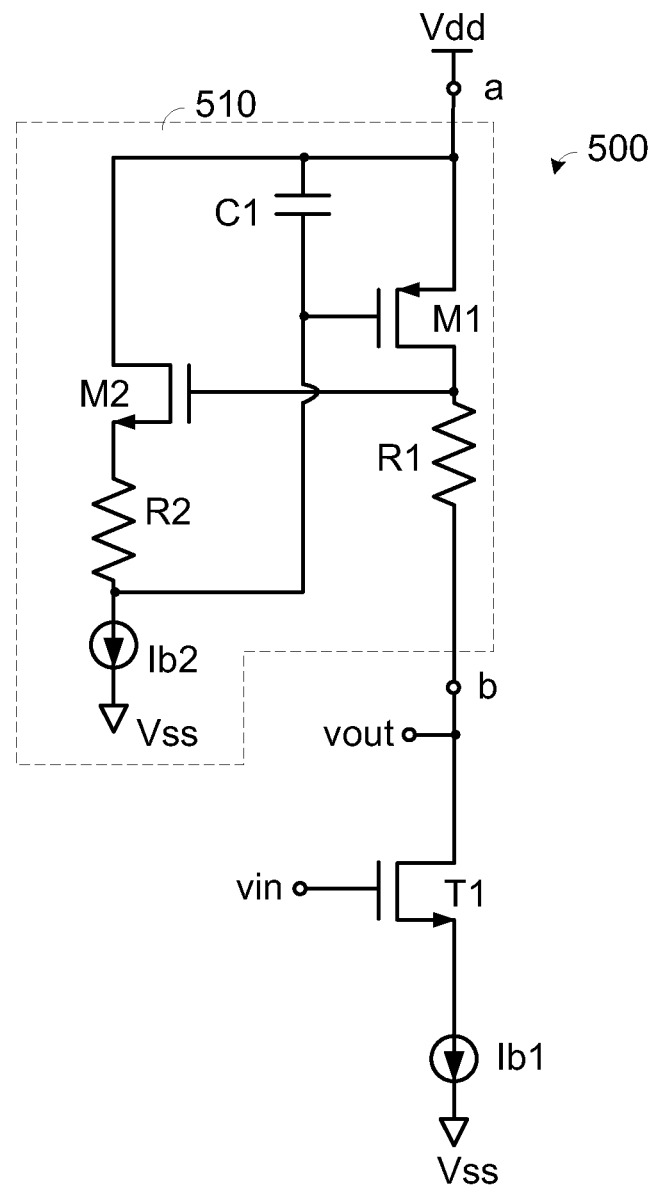
FIG. 5 is a schematic circuit diagram of an amplifying circuit with the active inductor of the present invention.

FIG. 5 is a schematic circuit diagram of an amplifying circuit with the active inductor of the present invention. As shown in FIG. 5, the amplifying circuit 500 comprises a transistor T1, a bias current source Ib1 and an active inductor 510. The gate terminal of the transistor T1 is an input terminal of the amplifying circuit 500 for receiving an input signal vi. The active inductor 510 is connected between the drain terminal of the transistor T1 and a first voltage source Vdd. The bias current source Ib1 is connected between the source terminal of the transistor T1 and the second voltage source Vss. Moreover, the drain terminal of the transistor T1 is an output terminal of the amplifying circuit 500 for outputting an output signal vo.

The active inductor 510 comprises a transistor M1, a transistor M2, a first resistor R1, a second resistor R2, a capacitor C1 and a bias current source Ib2. Moreover, the active inductor 510 has a first terminal "a" and a second terminal "b". The first terminal "a" of the active inductor 510 is connected to the first voltage source Vdd. The second terminal "b" of the active inductor 510 is connected to the output terminal of the amplifying circuit 500. The relationships between the components of the active inductor 510 are similar to those of FIG. 4B, and are not redundantly described herein.

Moreover, the active inductor of the present invention may be applied to a differential amplifying circuit. FIG. 6A is a schematic circuit diagram of a differential amplifying circuit with the active inductors of the present invention. FIG. 6B is a plot illustrating the relationships between the gain value and the frequency of the differential amplifying circuit of FIG. 6A.

As shown in FIG. 6A, the differential amplifying circuit 600 comprises a differential pair circuit 630, a first active inductor 610 and a second active inductor 620.

The differential pair circuit 630 comprises a transistor T1, a transistor T2 and a bias current source Ib1. The gate terminal of the transistor T1 is a first input terminal of the differential amplifying circuit 600 for receiving a positive input signal vin+. The first active inductor 610 is connected between the drain terminal of the transistor T1 and a first voltage source Vdd. The bias current source Ib1 is connected between the source terminal of the transistor T1 and a second voltage source Vss. Moreover, the drain terminal of the transistor T1 is a first output terminal of the differential amplifying circuit 600 for outputting a negative output signal vout−.

The gate terminal of the transistor T2 is a second input terminal of the differential amplifying circuit 600 for receiving a negative input signal vin−. The second active inductor 620 is connected between the drain terminal of the transistor T2 and the first voltage source Vdd. The source terminal of the transistor T2 is connected to the source terminal of the transistor T1. Moreover, the drain terminal of the transistor T2 is a second output terminal of the differential amplifying circuit 600 for outputting a positive output signal vout+.

The first active inductor 610 comprises a transistor M1, a transistor M2, a first resistor R1, a second resistor R2, a capacitor C1 and a bias current source 1b2. Moreover, the first active inductor 610 has a first terminal "a1" and a second terminal "b1". The first terminal "a1" of the first active inductor 610 is connected to the first voltage source Vdd. The second terminal "b1" of the first active inductor 610 is connected to the first output terminal of the differential amplifying circuit 600. The relationships between the components of the first active inductor 610 are similar to those of FIG. 4B, and are not redundantly described herein.

The second active inductor 620 comprises a transistor M3, a transistor M4, a third resistor R3, a fourth resistor R4, a capacitor C2 and a bias current source 1b3. Moreover, the second active inductor 620 has a first terminal "a2" and a second terminal "b2". The first terminal "a2" of the second active inductor 620 is connected to the first voltage source Vdd. The second terminal "b2" of the second active inductor 620 is connected to the second output terminal of the differential amplifying circuit 600. The relationships between the components of the second active inductor 620 are similar to those of FIG. 4B, and are not redundantly described herein.

Please refer to FIG. 6B, which illustrates the relationships between the gain value and the frequency of the differential amplifying circuit 600. The gain value at the corner frequency increases. In other words, the differential amplifying circuit 600 has an inductive load for increasing the bandwidth of the differential amplifying circuit 600.

From the above descriptions, the present invention provides an active inductor with a novel structure. Consequently, the active inductor is used as an inductive load and applied to an amplifying circuit to increase the circuit bandwidth.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An active inductor, comprising:
    a first transistor, wherein a source terminal of the first transistor is a first terminal of the active inductor and connected to a first voltage source;
    a capacitor, wherein a first terminal of the capacitor is connected to the source terminal of the first transistor, and a second terminal of the capacitor is connected to a gate terminal of the first transistor;
    a second transistor, wherein a drain terminal of the second transistor is connected to the source terminal of the first transistor, and a gate terminal of the second transistor is connected to a drain terminal of the first transistor;
    a first resistor, wherein a first terminal of the first resistor is connected to the drain terminal of the first transistor, and a second terminal of the first resistor is connected to a second terminal of the active inductor;
    a second resistor, wherein a first terminal of the second resistor is connected to a source terminal of the second transistor and a second terminal of the second resistor is connected to the gate terminal of the first transistor; and
    a bias current source, wherein a first terminal of the bias current source is connected to the second terminal of the second resistor, and a second terminal of the bias current source is connected to a second voltage source.

2. The active inductor as claimed in claim 1, wherein the first transistor is a P-type transistor, and the second transistor is an N-type transistor.

3. An amplifying circuit, comprising:
    a first transistor, wherein a gate terminal of the first transistor receives a first input signal, and a drain terminal of the first transistor generates a first output signal;
    a first active inductor connected between a first voltage source and the drain terminal of the first transistor; and
    a first bias current source connected between a second voltage source and a source terminal of the first transistor, wherein the first active inductor comprises a second transistor, a third transistor, a first capacitor, a first resistor, a second resistor and a second bias current source, wherein a source terminal of the second transistor is connected to the first voltage source, a first terminal of the first capacitor is connected to the source terminal of the second transistor, a second terminal of the first capacitor is connected to a gate terminal of the second transistor, a drain terminal of the third transistor is connected to the source terminal of the second transistor, a gate terminal of the third transistor is connected to a drain terminal of the second transistor, a first terminal of the first resistor is connected to the drain terminal of the second transistor, a second terminal of the first resistor is connected to the drain terminal of the first transistor, a first terminal of the second resistor is connected to a source terminal of the third transistor, a second terminal of the second resistor is connected to the gate terminal of the first transistor, a first terminal of the second bias current source is connected to the second terminal of the second resistor, and a second terminal of the second bias current source is connected to a second voltage source.

4. The amplifying circuit as claimed in claim 3, wherein the second transistor is a P-type transistor, and the third transistor is an N-type transistor.

5. The amplifying circuit as claimed in claim 3, further comprising:
a fourth transistor, wherein a gate terminal of the fourth transistor receives a second input signal, a drain terminal of the fourth transistor generates a second output signal, and a source terminal of the fourth transistor is connected to the source terminal of the first transistor; and
a second active inductor connected between the first voltage source and the drain terminal of the fourth transistor.

6. The amplifying circuit as claimed in claim 5, wherein the second active inductor comprises:
a fifth transistor, wherein a source terminal of the fifth transistor is connected to the first voltage source;
a second capacitor, wherein a first terminal of the second capacitor is connected to the source terminal of the fifth transistor, and a second terminal of the second capacitor is connected to a gate terminal of the fifth transistor;
a sixth transistor, wherein a drain terminal of the sixth transistor is connected to the source terminal of the fifth transistor, and a gate terminal of the sixth transistor is connected to a drain terminal of the fifth transistor;
a third resistor, wherein a first terminal of the third resistor is connected to the drain terminal of the fifth transistor, a second terminal of the third resistor is connected to the drain terminal of the fourth transistor;
a fourth resistor, wherein a first terminal of the fourth resistor is connected to a source terminal of the sixth transistor and a second terminal of the fourth resistor is connected to the gate terminal of the fifth transistor; and
a third bias current source, wherein a first terminal of the third bias current source is connected to the second terminal of the fourth resistor, and a second terminal of the third bias current source is connected to the second voltage source.

7. The amplifying circuit as claimed in claim 6, wherein the fifth transistor is a P-type transistor, and the sixth transistor is an N-type transistor.

* * * * *